United States Patent
Borghs et al.

(10) Patent No.: US 7,327,036 B2
(45) Date of Patent: Feb. 5, 2008

(54) METHOD FOR DEPOSITING A GROUP III-NITRIDE MATERIAL ON A SILICON SUBSTRATE AND DEVICE THEREFOR

(75) Inventors: Gustaaf Borghs, Leuven (BE); Stefan Degroote, Scherpenheuvel-Zichem (BE); Marianne Germain, Liège (BE)

(73) Assignee: Interuniversitair Microelektronica Centrum (IMEC), Leuven (BE)

( * ) Notice: Subject to any disclaimer, the term of this patent is extended or adjusted under 35 U.S.C. 154(b) by 50 days.

(21) Appl. No.: 11/019,908

(22) Filed: Dec. 21, 2004

(65) Prior Publication Data

US 2005/0199883 A1   Sep. 15, 2005

Related U.S. Application Data

(60) Provisional application No. 60/531,930, filed on Dec. 22, 2003.

(30) Foreign Application Priority Data

Apr. 2, 2004   (EP) ................... 04447087

(51) Int. Cl.
*H01L 21/20* (2006.01)
(52) U.S. Cl. ............. 257/762; 438/483; 438/767; 438/933; 257/E33.018; 257/E33.025
(58) Field of Classification Search ........... 438/455, 438/458, 409, 151, 457, 483, 762, 767, 775, 438/933; 247/77–79; 257/E33.018, E33.025
See application file for complete search history.

(56) References Cited

U.S. PATENT DOCUMENTS

| | | | |
|---|---|---|---|
| 4,529,455 A | * | 7/1985 | Bean et al. ............. 438/492 |
| 4,806,996 A | * | 2/1989 | Luryi ..................... 257/190 |
| 6,344,375 B1 | | 2/2002 | Orita et al. |
| 6,602,760 B2 | * | 8/2003 | Poortmans et al. ...... 438/455 |
| 6,818,531 B1 | * | 11/2004 | Yoo et al. ............... 438/458 |
| 2002/0096683 A1 | * | 7/2002 | Ramdani et al. ......... 257/76 |
| 2002/0106882 A1 | * | 8/2002 | Poortmans et al. ...... 438/605 |
| 2003/0153161 A1 | * | 8/2003 | Chu et al. .............. 438/455 |
| 2003/0216043 A1 | | 11/2003 | Poortmans et al. |
| 2005/0211988 A1 | * | 9/2005 | Leycuras ................ 257/77 |

FOREIGN PATENT DOCUMENTS

| | | |
|---|---|---|
| EP | 1132952 A1 | 9/2001 |
| FR | 2836159 A | 8/2003 |
| WO | WO 03/054939 A1 | 7/2003 |

OTHER PUBLICATIONS

European Search Report mailed Apr. 21, 2005, for European Application No. 0447292.6.

(Continued)

*Primary Examiner*—Thao X. Le
*Assistant Examiner*—Abul Kalam
(74) *Attorney, Agent, or Firm*—Knobbe Martens Olson & Bear LLP (57) ABSTRACT

The present invention is related to a device comprising a substrate comprising a silicon substrate having a porous top layer, a second layer on said top layer, said second layer made of a material comprising Ge, and a further layer of a Group III-nitride material on the second layer. The present invention further is related to methods of production and to intermediate or template devices highly suitable for the epitaxial growth of a high quality Group III-nitride layer.

15 Claims, 5 Drawing Sheets

```
substrate + patterned top layer
```

```
substance comprising Ge
```

```
thermal annealing
```

```
substance comprising groupIII el.
substance comprising N
```

OTHER PUBLICATIONS

Boufaden, et al.: "GaN growth on porous silicon by MOVPE", Microelectronics Journal, Mackintosh Publications Ltd., Luton, GB, vol. 34, No. 9, Sep. 2003, pp. 843-858.

Canham, et al. 'Atmospheric impregnation of porous silicon at room temperature', J. Appl. Phys. 70(1), Jul. 1991, pp. 422-431.

Krost, et al.'GaN-Based Devices on Si', Phys.Stat.Sol. (a), vol. 194, Issue 2, 2002, pp. 361-375.

Kuykendall (NanoLetters 2003, vol. 3, No. 8, 1063-10).

European Search Report mailed Oct. 21, 2004, for European Application No. 04447087.0-1528.

* cited by examiner

Fig.2

```
   substrate + patterned top layer
```

```
   substance comprising Ge
```

```
   thermal annealing
```

```
   substance comprising groupIII el.
   substance comprising N
```

METHOD FOR DEPOSITING A GROUP III-NITRIDE MATERIAL ON A SILICON SUBSTRATE AND DEVICE THEREFOR

RELATED APPLICATION

This application claims priority under 35 U.S.C. § 119(e) to U.S. provisional application Ser. No. 60/531,930, filed Dec. 22, 2003, the disclosure of which is hereby incorporated by reference in its entirety and is hereby made a part of this specification.

FIELD OF THE INVENTION

The present invention is related to a method for depositing a Group III-nitride material on a silicon substrate and a device therefor. It also relates to devices with epitaxial layers of improved quality.

BACKGROUND OF THE INVENTION

Due to the lack of commercially available GaN substrates, GaN heterostructures are nowadays grown mainly on sapphire and SiC. Si is however a very attractive substrate, gaining more and more interest. Its main advantages are: an acceptable thermal conductivity (half of that of SiC) and its availability in large quantities and large wafer sizes. The most important advantage of Si compared to sapphire and SiC is its very low cost.

Kuykendall (NanoLetters 2003, Vol. 3, No. 8, 1063-10) discloses for instance the formation of GaN nanowires on silicon and sapphire substrates by MOCVD.

However, the growth of high quality epitaxial GaN layers directly on Si is not straightforward.

The high lattice mismatch between Si and GaN results in a high dislocation density in the GaN layer. This high dislocation density can be drastically decreased by adapting suitable growth recipes developed for the growth of GaN on sapphire.

The large difference in thermal expansion coefficient between GaN and Si induces large tensile stress in the GaN film during cooling down from the growth temperature to room temperature, resulting in cracking of the GaN layer. The phenomenon of cracking becomes problematic for layers with a thickness of 1 micron and more, and thus is detrimental for the performance of (opto)electronic devices.

Another problem for the growth of GaN directly on Si is the so-called meltback etching process of Ga and Si. At high temperatures, Ga and Si form an alloy, which initiates a strong and fast etching reaction destroying the substrate and the GaN layer. This results in a very rough surface.

Yet another problem relates to oxide formation on the Si substrate that requires specific attention, such as a careful cleaning just before loading samples in the reactor for the growth of GaN on the substrate.

A further problem for the growth of GaN on Si is the "bowing" of the substrate. When a layer of GaN is formed on Si, strain generated in the layer of GaN will consequently generate strain in the Si substrate. This results in deformation or the so-called 'bowing' of the Si substrate.

In patent application WO 03/054939 Aixtron discloses a method for depositing a III-V layer on a non III-V substrate, such as a silicon substrate. A III-V buffer layer or a III-V germination layer is deposited on the substrate by MOCVD.

For the growth of an active GaN layer, Boufaden et al. (Microelectronics Journal 34 (2003) 843-848) proposed to use a thin AlN layer to improve wetting between GaN and a porous Si/Si substrate. The AlN layer would reduce the lattice mismatch between GaN and Si to 2.5%. Also Orita et al. proposed in U.S. Pat. No. 6,344,375 a buffer layer of AlN between a porous Si layer (PS) and a GaN epitaxial layer.

Different methods to reduce cracks and threading dislocations have been reviewed in 'GaN-Based Devices on Si', A. Krost and A. Dadgar, Phys. Stat. Sol. (a), Vol. 194, Issue 2, 2002, pp. 361-375.

The different approaches proposed to address the above-mentioned problems can be separated in two categories: those using a completely in-situ growth recipe and those requiring ex-situ processing steps followed by subsequent growth steps. The former group is based on strain engineering, using proper seed-, super- or interlayers, to avoid cracking and to reduce as much as possible the threading dislocation density existing in the active GaN layer. The latter group aims at controlling the geometrical distribution of the thermal cracks and of the threading dislocations. ELOG, Pendeo, Cantilever Epitaxy all lead to high quality areas, while other concentrates all the threading dislocations and/or cracks arising from the stress.

SUMMARY OF THE INVENTION

The present invention aims to provide a novel method for depositing a Group III-nitride material on a silicon substrate overcoming the problems of the prior art solutions.

Another aim is to provide devices with a high-quality Group III-nitride epitaxial layer.

Yet another aim is to provide suitable intermediate template devices for growth of such a high-quality epitaxial Group III-nitride layer.

In a first aspect of this invention a device is disclosed comprising:

a substrate comprising a silicon substrate having a porous top layer, a second layer on said top layer, said second layer made of a Ge material, and a further layer of a Group III-nitride material on said second layer.

By a "porous top layer" in the present context is meant amongst others a top layer consisting essentially of porous silicon (PS) but also an artificially created porous material, like a castellated or a two-dimensional submicron patterned top layer.

Such "porous top layers" provide a rough, textured, non-flat, preferably 3-D structured surface and a supple skeleton. Voids, bubbles or inclusions may be present under the surface of such porous top layer. The closure of pores at the surface of the porous top layer can lead to the formation of voids, bubbles, inclusions, micropores etc.

"Porous top layer" means that at least part (possibly essentially all) of the pores are open at the surface of said top layer, but at least part of the pores at the surface may be closed. Alternatively, all pores may be closed and voids, bubbles, inclusions or micropores can be formed in the substrate.

In an embodiment of the first aspect of this invention, a device as recited in any of the previous embodiments is disclosed wherein the porous top layer comprises at least in part closed pores such as voids, inclusions, bubbles or micropores.

A gradient in porosity may exist in the porous top layer according to a preferred embodiment of the invention. Preferably the pore size and/or amount of pores increases in a direction away from the surface of the top layer.

Top layers with at least a double porosity may be advantageous. Hereby is meant that at least two sublayers with different porosity are present in said top layer. The difference may again lay in the size of the pores and/or in the amount of pores.

It is also possible to have a stacking of layers with a high and low porosity, meaning that layers with a high and low porosity alternate. A high porosity refers to the presence of large pores and/or to the presence of a high amount of pores compared to the presence of small-sized pores and/or the presence of a lower amount of pores (low porosity). Ways of creating layers of high and low porosity are known in the art.

It may be advantageous to create a separation layer under a high porosity sublayer in contact with a silicon substrate, for instance by high temperature annealing in hydrogen. This separation layer is a highly porous layer and is mechanically very weak. It can easily be broken by little mechanical force, e.g. by ultrasonic treatment or pulling (see e.g. EP 1132952).

The porous top layer according to the invention typically has a porosity between 10% and 90%. It typically has a thickness of between 10 nm and 10 µm, between 10 nm and 3 µm.

"Porous top layers" according to the invention are able to relax strain after growth. Furthermore, the epitaxial layer can be separated from the substrate by stress release.

By a "layer made of a Ge material" is meant a layer made of a material that comprises at least Ge.

In a preferred embodiment of the first aspect of this invention, a device as recited in any of the previous embodiments is disclosed wherein the second layer is made of a SiGe material (a material comprising at least SiGe). The second layer can be a SiGe layer. The composition of the layer made of a Ge material, preferably a SiGe material, is optionally graded. Advantageously the Ge concentration in said material of said second (graded) layer is increased in a direction away from the substrate.

In a preferred embodiment of the first aspect of this invention, a device as recited in any of the previous embodiments is disclosed wherein the Group III-nitride material comprises at least GaN. In a preferred embodiment of the first aspect of this invention, a device as recited in any of the previous embodiments is disclosed wherein the Group III-nitride material is GaN.

Alternatively, the Group III-nitride material may comprise at least AlN or may be AlN. Another possibility is to grow for instance a Group III-nitride epitaxial layer comprising at least AlGaN.

Advantageously, a device as recited in any of the previous embodiments is disclosed wherein the second layer is in direct contact with said top layer. Advantageously, a device as recited in any of the previous embodiments is disclosed wherein the Group III-nitride layer, for instance a GaN layer, is in direct contact with the second layer.

In an embodiment of the first aspect of this invention, a device as recited in any of the previous embodiments is disclosed wherein the second layer (made of a Ge material such as SiGe) has a thickness between 1 nm and 1000 nm or 2000 nm, and more preferably between 1 nm and 500 nm, even more preferably between 1 nm and 300 nm, between 10 nm and 200 nm.

The thickness of a layer of a Ge material preferably is between 1 nm and 100 nm, between 1 nm and 50 nm, between 1 nm and 20 nm, between 1 nm and 15 nm, between 1 nm and 10 nm. The thickness of a layer comprising a Ge material preferably is between 1 nm and 20 nm, more preferably between 5 and 15 nm, most preferably between 6 and 12 nm.

In a preferred embodiment of the invention, a device according to the invention is disclosed wherein the top layer is a porous top layer according to the invention, the second layer is made of a SiGe material (e.g. a SiGe layer) and wherein the further layer is a GaN layer. Advantageously the layer of a SiGe material, such as a SiGe layer, is in direct contact with said top layer. Advantageously the GaN layer is in direct contact with this second layer. The thickness of the second layer in the here described embodiment is preferably between 1 nm and 2 micrometer, between 1 nm and 1000 nm, between 1 nm and 500 nm, between 1 nm and 300 nm and between 10 nm and 200 nm.

Pores in the top layer may be open pores or may present a combination of closed and open pores. As such, another particularly preferred device according to the invention is one wherein the porous top layer according to the invention comprises at least in part closed pores, wherein the second layer is made of a SiGe material (e.g. a SiGe layer) and wherein the further layer is a GaN layer. Substantially all pores (over 70%, 80% or 90% or 95% of the pores) may be closed pores.

Examples of closed pores include but are not limited to bubbles, inclusions, voids or micropores. Micropores have a small diameter of reduced size (compared to the diameter of the initial pores in the porous Si substrate) as a consequence of for instance an annealing step before deposition of a Group III-nitride layer. The temperature of the annealing step is higher than the temperature of the step of depositing he group III-nitride material. The deposition temperatures for GaN is between 500 and 1300° C., about 1100° C., about 1050° C. while the annealing temperature is higher than 1050° C., higher than 1100° C., and prefarbly between 1100° C. and 1200° C.

In a preferred embodiment of the invention, a device according to the invention is disclosed wherein the second layer is a layer made of Ge or is a layer made of graded SiGe, and wherein the further layer is a GaN layer. Advantageously the Ge concentration in the graded SiGe increases in a direction away from said substrate.

The device as recited in any of the previous embodiments can further advantageously comprise an intermediate (third) layer. The intermediate layer is between the second layer (the layer made of a Ge material, like a SiGe material) and the Group III-nitride layer (the further layer). The intermediate layer advantageously is arranged such that it can serve as a basis for the growth of the Group III-nitride layer or as layer from which the growth of the Group III-nitride layer starts. It can advantageously be is kind of a nucleation layer. The intermediate layer, can be a layer with a thickness in the range between 1 nm and 200 nm, between 1 nm and 100 nm and between 1 nm and 50 nm. The intermediate layer can be a flat continuous layer or can be a discontinuous layer comprising for instance islands. The intermediate layer can be an AlN layer.

In another embodiment of the invention, a device according to the invention is disclosed wherein the second layer is a layer made of Ge or is a layer made of graded SiGe, wherein the intermediate layer is a layer made of AlN, and wherein the further layer is a GaN layer. Advantageously the Ge concentration in the graded SiGe increases in a direction away from said substrate.

In another embodiment of the invention, a device according to the invention is disclosed wherein the second layer a layer made of SiGe, and wherein the further layer is an AlN layer.

The invention also relates to a FET, a LED, a laser diode, a HEMT (high electron mobility transistor) or a heterojunction bipolar transistor comprising a device according to the invention recited in any of the previous embodiments of the invention.

In a specific embodiment of the first aspect of this invention, a device as recited in any of the previous embodiments is disclosed wherein an electronic circuitry is integrated in the silicon substrate. The device may also comprises an optoelectronic element or a FET formed in the Group III-nitride layer.

A second aspect of this invention relates to a method for forming a device comprising a Group III-nitride material on silicon, comprising the steps of (see FIG. 1):
 providing a silicon substrate comprising a porous top layer (as defined),
 subjecting said silicon substrate with said porous top layer to a Ge comprising substance, thereby forming a (second) layer of a Ge material on said top layer,
 subjecting the silicon substrate with the layer of a Ge material to a substance comprising a Group III element and a substance comprising N, thereby forming a further layer of a Group III-nitride material on said second layer.

Figure 1:
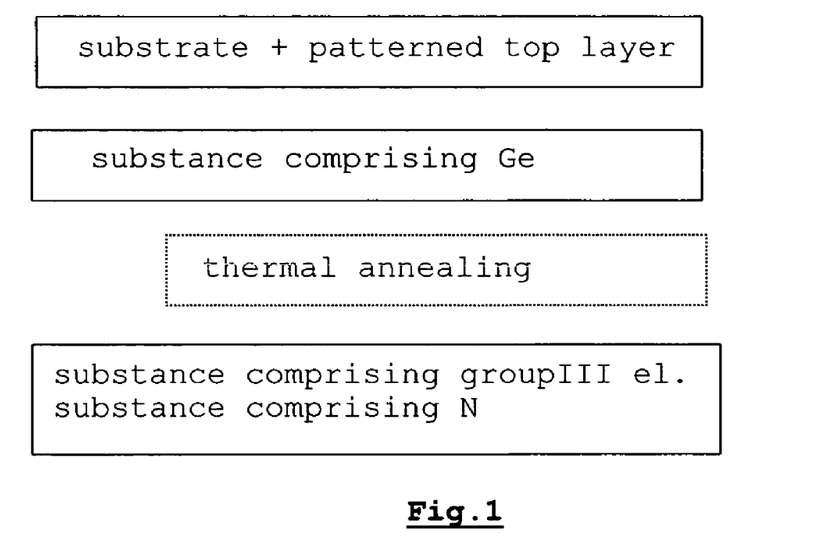
FIG. 1 represents a flow chart showing the (mandatory and optional) steps of the method. Optional steps are indicated by a dotted line.

In a preferred embodiment of the second aspect of this invention, a method as recited in any of the previous embodiments is disclosed wherein the method further comprises the step of thermally annealing the layer made of a Ge material prior to the step of subjecting the silicon substrate with said layer of a Ge material to a substance comprising a Group III element and a substance comprising N (optional step in FIG. 1). Advantageously the step of thermally annealing is performed at a temperature between 500° C. and 1300° C. and more advantageously between 500° C. and 1100° C.

Preferably the step of subjecting the silicon substrate with the porous top layer to a substance comprising Ge is performed by plasma enhanced chemical vapour deposition (PECVD), thermal evaporation, close space vapour transport or molecular beam epitaxy.

Advantageously after deposition of the second layer, the (intermediate) device may be stored for a predetermined period, id est for hours, weeks, months or even years, without the necessity of having to store the device under a protective atmosphere (like a $N_2$ atmosphere As such, advantageously, a method as recited in any of the previous embodiments is disclosed wherein an intermediate device is stored after the step of forming the second layer on said top layer.

Preferably the step of subjecting the silicon substrate with the layer of a Ge material to a substance comprising a Group III element and a substance comprising N is performed by a metal organic chemical vapour deposition (MOCVD) process. This step is typically performed at a temperature between 500° C. and 1300° C., between 1000 and 1100° C., and preferably at 1050° C.

In another embodiment, the step of subjecting the silicon substrate with the layer of a Ge material to a substance comprising a Group III element and a substance comprising N is performed by a molecular bean epitaxy (MBE) or Hydride vapour phase epitaxy (HVPE).

In another embodiment, the step of subjecting the silicon substrate with the layer of a Ge material to a substance comprising a Group III element and a substance comprising N is preceded by an annealing step. The annealing step results in the formation of a stable layer. For example, the structure of the porous top layer and the second layer can change during the annealing step. Consequently. the underlying layers will be less susceptible for structural changes (such as, but not limited hereto, changing of the pores structure) during the step of subjecting silicon substrate with the layer of a Ge material to a substance comprising a Group III element and a substance comprising N. Also, after the annealing step, the second layer will be a layer made SiGe.

In a preferred embodiment of the second aspect of this invention, a method as recited in any of the previous embodiments is disclosed, wherein the Group III element is Ga. Most preferably the Group III-nitride is GaN. The Group III nitride material can also be Al N or AlGaN.

In another preferred embodiment of the second aspect of this invention, a method as recited in any of the previous embodiments is disclosed, wherein the Group III element is Al, and the Group III-nitride AlN.

In a preferred embodiment of the second aspect of this invention, a method as recited in any of the previous embodiments is disclosed, wherein said method further comprises the step of forming an intermediate layer between the step of subjecting said silicon substrate with said porous top layer to a substance comprising Ge and the step of subjecting said silicon substrate with said layer of a Ge material to a substance comprising a Group III element and a substance comprising N. Advantageously an intermediate AlN layer is hereby formed.

The AlN layer can be deposited by MOCVD in the MOCVD reactor at high temperature such as between 900° C. and 1200°. Alternatively, the AlN layer can be grown at low temperature such as between 400° C. and 900° C., between 500° C. and 800° C., followed y a thermal anneal step.

In a preferred embodiment of the second aspect of this invention, a method as recited in any of the previous embodiments is disclosed, wherein the deposition of a Group III-nitride layer, such as a GaN layer, is performed at two different temperatures between 500° C. and 1300° C. Advantageously, the first part of said deposition step is performed at a lower temperature, (e.g. a temperature of between 400° C. and 800° C., of between 400° C. and 700° C., of between 400° C. and 600° C.) followed by a step at higher temperature (e.g. a temperature of between 800° C. and 1200° C., of between 800° C. and 1100° C., of between 800 and 1000° C.).

A third aspect of the invention relates to a device obtainable by any of the above described methods. Examples of such devices, obtainable by any of the above disclosed methods according to the invention, are given in the section related to the first aspect of the invention.

A fourth aspect of this invention relates to a method for forming an (intermediate) template device for the deposition of a Group III-nitride material, said method comprising the steps of
 providing a silicon substrate comprising a porous top layer,
 subjecting said silicon substrate with porous top layer to a substance comprising Ge, thereby forming on said top layer a second layer, said second layer made of a material comprising Ge,
 optionally followed by the step of thermally annealing said (second) layer made of a material comprising Ge.

Preferred embodiments with respect to ways of forming the different layers, their composition and thickness have been described in the sections related to aspects 1 to 3 of the present invention.

This method results in a template device highly suitable for the deposition of a Group III-nitride material, said template device comprising a substrate that comprises a silicon substrate having a porous top layer, and on said top layer a second layer, said second layer made of a material comprising Ge. Advantageously, said top layer is arranged such that a Group III-nitride material can be deposited on said second layer. Advantageously at least part of the pores of the top layer may be closed pores. Still a further aspect of the invention relates to template devices obtainable by a method of forming such template device according to the invention.

Yet a further aspect of the present invention relates to the use of an (intermediate) template device for the deposition of a Group III-nitride material, said template device comprising a substrate that comprises a silicon substrate having a porous top layer, and a second layer on said top layer, said second layer made of a material comprising Ge. Advantageously, said top layer is arranged such that a Group III-nitride material can be deposited on said second layer. Advantageously at least part of the pores of the top layer may be closed pores or pores with reduced diameter. Possible thickness and/or layer composition, etc are as indicated in the sections related to the first and second aspect of the present invention.

DETAILED DESCRIPTION OF THE PREFERRED EMBODIMENT

The present invention is described in detail in the sequel. It is apparent however that a person skilled in the art can imagine several other equivalent embodiments or other ways of executing the present invention.

For the purpose of this invention, when a layer is referred to as being "on" or "over" another layer or substrate, it is meant that the layer is directly on the other layer or substrate or that an intermediate layer is present. When a layer is referred to as being "in direct contact with" another layer or substrate, it is meant that there is no intermediate layer present between the two layers or between the layer and the substrate.

For the purpose of this invention, a Group III-nitride material is a material comprising a nitride of an element of Group III of the periodic table of elements. A Group III-nitride material can be GaN, whereby GaN is to be understood as a material comprising at least GaN, such as, but not limited hereto, AlN, AlGaN, InGaN, AlInGaN, GaAsPN and the like. The device as recited in this invention can also comprise a diamond layer instead of a Group III-nitride material.

A silicon substrate is a substrate comprising silicon. In a specific embodiment the silicon substrate is a silicon wafer. The silicon substrate can comprise a porous top layer according to the invention (as defined above).

By "castellated" is meant that the cross section of the substrate at the major surface is characterized by steep hills and valleys, the tops of the hills defining flat plateau surface portions that are mutually separated from one another by gaps formed by the valleys. Advantageously, each of the plateaus has a maximum lateral extent of less than a micron, preferably of less than 200 Angstrom and most preferably of less than 100 Angstrom, with respect to any direction along the top surface of the plateau. Preferably, neighbouring plateaus are separated from one another by gaps of at least 30 Angstrom, more preferably of at least 60 Angstrom wide.

By "two-dimensionally submicron patterned" is meant that the surface is characterized by flat plateaus of any arbitrary shape, each plateau having a maximum lateral extent with respect to any direction along the top surface of the plateau of less than a micron, with gaps formed by grooves located between the plateaus, for example, as obtained by nanometer lithography described by Douglas et al. (Applied Physics Letters (1986), vol 48 (10) 676-678).

The term "pores" in the present context extends to the "gaps", "valleys" or "grooves" as described above. The "pores" in the porous top layer according to the invention may be open pores, closed pores or may present a combination of open and closed pores such as bubbles, inclusions, voids or micropores.

In a first aspect of this invention, a device is disclosed, the device comprising:
  a substrate comprising a silicon substrate having a porous top layer, said second layer made of a Ge material, and
  a further layer of a Group III-nitride material on said second layer.

Preferably, the second layer comprises SiGe. The Group III-nitride material preferably comprises at least GaN. Preferably the Group III-nitride material is GaN. Alternatively, the Group III-nitride material may comprise at least AlN or be AlN.

The lattice mismatch between Si and a Group III nitride material is very high. By adding Ge to Si and performing an annealing step a layer of SiGe is formed, having an even higher lattice mismatch.

Also the difference in thermal expansion coefficient between the two materials (Si and a Group III-nitride material) is very high, resulting in extra stress in the Group III-nitride layer such as a GaN layer during cooling down after the GaN deposition.

The difference in thermal stress between Si and the group III nitride material, preferably GaN, will decrease when a SiGe layer is formed between Si and the Group III-nitride material. Consequently, the occurrence of cracks in the group III nitride material layer is decreased.

On one hand, the layer of a Ge material thus drastically reduces thermal stress, which in fact appears to be the major bottleneck for growth of a Group III-nitride material such as GaN on Si and not the lattice mismatch.

Dislocations in the Group III-nitride material such as GaN layer may still occur. This problem can be solved by the use of a porous Si layer according to the invention, which is very flexible. The porous Si according to the invention will allow the substrate to accommodate to the large lattice mismatch between silicon and the Group III-Nitride layer, and thus reduces the dislocation density in the latter layer. Moreover, use of the substrate according to the invention will avoid cracks of the Group III-nitride layer during cooling of the device. A further advantage is the fact that "bowing" of the substrate is avoided.

The substrate choice (silicon with a porous layer according to the invention) is not straightforward: Porous Si is thermally instable (it can deform at high temperatures) and can absorb moisture from the environment.

The layer of a Ge material is deposited at a temperature 300° C. and 800° C., preferably at 500° C., in contrast to the high depositions temperatures for AlN and GaN standardly used in the art.

On the other hand, a Ge layer thus mainly acts as a protective layer to avoid oxidation of the porous Si according to the invention. Consequently the structural modification of the porous Si layer is avoided. GaN layers or AlN layers grown directly on a silicon substrate according to the invention would not prevent oxidation of the porous Si substrate.

In addition, the deoxidation temperature of Ge is much lower than the critical temperature at which porous Si recrystallises into (bulk) Si with voids, whereas the deoxidation temperature of Si is well above this transition temperature. Voids can be considered as micropores in the porous Si.

The Ge interlayer will also prevent nitridation of the Si substrate so that no or a minimal amount of amorphous SiNx compounds can be formed at the interface. Formation of amorphous thick SiNx materials is highly disadvantageous with respect to further epixial growth of the device. The Ge interlayer also reduces the intermixing of Ga and Si and thus prevents meltback etching.

The advantageous effects of a second layer made of a Ge material according to the invention are obtained already when a very thin layer of a material comprising Ge is applied on top of a Si substrate with a top layer according to the invention, for instance a layer with a thickness of between 1 and 20 nm, 5 and 15 nm, 6 and 12 nm.

A device as obtainable by a method according to the invention is a device of high quality.

It was found that a layer of a Ge comprising material on a Si substrate having a top layer according to the invention provides a surface that is highly suited for the epitaxial growth of high-quality wide band gap Group III-nitride semiconductor materials, in particular for the growth of GaN. Epitaxial layers of high quality were obtained as such, with excellent crystallinity, very few cracks and reduced bowing compared to growth on a non-porous Si subsrate without Ge layer.

Below some preferred devices according to the invention are described:

A first such device is one that comprises:
a substrate comprising a silicon substrate having a porous top layer,
on said porous top layer a second layer, said second layer made of material comprising SiGe, and
a GaN layer on this second layer.
Pores in said porous layer may be open pores, or may be a combination of closed and open pores.

In an embodiment of the invention the layer of a SiGe material (a material comprising at least SiGe) is in direct contact with said top layer. In a specific embodiment the GaN layer is in direct contact with the layer of a SiGe material. The second layer advantageously is a SiGe layer.

The thickness of the layer of a SiGe material in the here described embodiment is between 1 nm and 2 micrometer, between 1 nm and 1000 nm, between 1 nm and 500 nm, between 1 nm and 300 nm and between 10 nm and 200 nm.

Another preferred device is one that comprises:
a substrate comprising a silicon substrate having a porous top layer comprising at least in part closed pores,
on said top layer a second layer, said second layer made of material comprising SiGe, and
a further GaN layer on this second layer.

The second layer advantageously is a SiGe layer.

The substrate comprising a silicon substrate having a top layer comprising at least in part closed pores, for instance voids, is for instance formed after deposition of the GaN layer and cooling down. During the first step in the deposition process of GaN (this is the annealing step) the porous silicon layer is transformed into bulk Si comprising voids.

The invention also discloses a device comprising a substrate and a layer of a Group III-nitride material. In an embodiment the device comprises:
a substrate comprising a silicon substrate having a porous top layer,
on said top layer a second layer, said second layer being a Ge layer or a graded SiGe layer, and
a GaN layer on said second layer.

Advantageously, the second layer made of Ge material, like a Ge layer or a layer made of graded SiGe, is in direct contact with said top layer. Advantageously, the Ge concentration in said graded SiGe increases in a direction away from said substrate. Advantageously the GaN layer is in direct contact with the second layer.

The porous Si layer and the Ge layer will diffuse, resulting in the formation of a SiGe layer, possibly a graded SiGe layer, at least in the lower part of the layer, id est the part near the Si substrate.

The thickness of the Ge layer or of the graded SiGe layer in the here described embodiment is between 1 nm and 1000 nm, between 1 nm and 500 nm, between 1 nm and 300 nm and between 10 nm and 200 nm. More preferably, the thickness of the Ge layer or of the graded SiGe layer is between 1 and 100 nm, between 1 and 50 nm, between 1 and 20 nm, between 1 and 15 nm, between 1 and 10 nm.

The substrates according to the invention, disclosed in any of the above embodiments, are very useful for the epitaxial growth of high-quality wide band gap Group III-nitride semiconductor materials, in particular for the growth of GaN. In particular, substrates prepared according to a method comprising an annealing step and/or comprising a Group III-nitride deposition in two steps (a first step at a lower temperature, followed by further growth at higher temperatures) and/or with a Ge layer are highly suitable for these purposes.

All of the above described devices can be at least a portion of a device region. The device can be part of a FET, a LED, a laser diode, a HEMT or a heterojunction bipolar transistor.

In another aspect of the invention the use of e.g. a Si/pSi/SiGe substrate for the growth of a Group III-nitride material is disclosed, where pSi denotes porous Si according to the invention. The Si/pSi/SiGe substrate, also referred to as template device, comprises a silicon substrate having a porous top layer and a layer of a SiGe material (second layer) on said top layer. The term "Si/pSi/SiGe substrate" in fact refers to all template devices disclosed in the present invention, id est devices with a layer made of a Ge material (preferably a SiGe layer) as second layer.

By using the Si/pSi/SiGe substrate according to the invention for the growth of Group III-nitride materials, the problems of the prior art solutions are solved. Moreover, the Si/pSi/SiGe substrate of the invention, preferably with at least part of the pores closed, can be formed and stored until deposition of the Group III-nitride material. The storage can be for a few hours, a few days, a month or even longer.

In a further aspect of this invention, a method for forming a template device as described above is disclosed. The method comprises the steps of:

providing a silicon substrate comprising a porous top layer, subjecting said silicon substrate with said porous top layer to a substance comprising Ge, thereby forming on said top layer a second layer, said second layer made of a material comprising Ge, preferably followed by the step of thermally annealing said layer made of a material comprising Ge.

The step of providing a silicon substrate and the step of subjecting said silicon substrate to a Ge comprising substance can be performed and the resulting substrate can be stored. The step of subjecting said substrate with said layer of a Ge material to a Group III element comprising substance and an N comprising substance can be performed when the device needs to be further processed.

Advantageously said annealing step is performed prior to subjecting said silicon substrate with said layer of a Ge material to a Group III element comprising substance and an N comprising substance. In a preferred embodiment the Group III element is Ga. Alternatively the Group III element may be Al.

The step of thermally annealing said layer of a Ge material prior to the step of subjecting said layer to a Group III (e.g. Ga) comprising substance results in the removal of the oxide (formed on the Ge layer) and the formation of a layer of a SiGe material, possibly a graded SiGe material, on the porous Si top layer. The thermally annealing step is advantageously performed at a temperature between 500° C. and 1300° C., preferably between 500° C. and 1100° C.

The step of subjecting the silicon substrate with the porous top layer to a Ge comprising substance avoids the formation of SiO2 on the porous top layer. From the prior art (see '*Atmospheric impregnation of porous silicon at room temperature*', Canham et al., *J. Appl. Phys.* 70(1), July 1991, pp. 422-431), it is known that a clean fluorinated hydride surface of freshly etched silicon substrates is converted to a contaminated native oxide during the exposure to ambient air for longer time, resulting in a continuous modification of the structural properties.

The method of the invention may further comprise the step of subjecting said silicon substrate with said Ge layer to a Group III element comprising substance and an N comprising substance, thereby forming a Group III-nitride layer on the second layer.

The method can further comprise the step of forming an intermediate (third) layer between the second layer of a Ge material and the Group III-nitride layer (the further layer). The intermediate layer advantageously is arranged such that it can serve as a basis for the growth of the Group III-nitride layer or as layer from which the growth of the Group III-nitride layer starts. The intermediate layer can be a layer with a thickness in the range between 1 nm and 200 nm, between 1 nm and 100 nm and between 1 nm and 50 nm. The intermediate layer can be a flat continuous layer or a discontinuous layer comprising islands. The intermediate layer can be an AlN layer.

The intermediate AlN layer can introduce reasonable compressive stress in the GaN layers grown over it, which during cooling down of the heterostcrutures compensate large thermal tensile stress due to thermal mismatch and further reduce cracking.

The thickness of the AlN layer is between 1 nm amd 2 micrometer, between 10 nm and 1000 nm, between 10 nm and 500 nm. The AlN layer is grown at a temperature between 500 C and 900 C or between 900 C and 1100 C.

The step of subjecting the silicon substrate with the porous top layer to a Ge comprising substance can be performed by plasma enhanced chemical vapour deposition (PECVD), thermal evaporation, close space vapour transport or molecular beam epitaxy.

Deposition of a Ge layer typically takes a few seconds. After the process of preparing a porous silicon substrate, this substrate with porous top layer according to the invention may be stored for a few seconds, for minutes or a few hours (up to 2 hours) under a protective atmosphere (like an $N_2$ atmosphere), whereafter the layer of a Ge material is then deposited.

For the step of subjecting said Ge layer to a Group III element comprising substance and a N comprising substance to grow a Group III-nitride layer, the wafer is preferably loaded in a metal organic chemical vapour deposition (MOCVD) reactor. The wafer can also be loaded in an MBE reactor or a HVPRE reactor. Prior to deposition the substrate is annealed in $H_2$ atmosphere for instance to remove the oxide. During this annealing step a stable epitaxial Ge-silicide layer is formed.

The substance comprising a Group III element can be TMGa (trimethyl Gallium) while the N comprising substance can be $NH_3$. In an embodiment the step of subjecting said layer of a Ge material to a Group III element comprising substance and a N comprising substance can be performed at a temperature between 500° C. and 1300° C., preferably between 1000° C. and 1100°.

Alternatively the step of subjecting said layer of a Ge material to a Group III element comprising substance and a substance comprising N can be performed at two different temperatures between 500° C. and 1300° C. The first part of the step may be performed at a lower temperature, (e.g. a temperature of between 400° C. and 800° C.) followed by a step at higher temperature (e.g. a temperature of between 800° C. and 1200° C.).

The step of subjecting said layer of a Ge material to a substance comprising a Group III element and a substance comprising N results in the formation of a layer of Group III-nitride material. Advantageously the layer of Group III-nitride material is a material comprising at least GaN. Alternatively, the layer of Group III-nitride material may be a material comprising at least AlN.

In an embodiment, the substrate can be formed starting from a Si wafer, of which the top layer is made porous by a method known to a person skilled in the art. In an embodiment the top layer can be made porous for instance by an anodic reaction with concentrated hydrofluoric (HF) acid.

EXAMPLE

Figure 2:
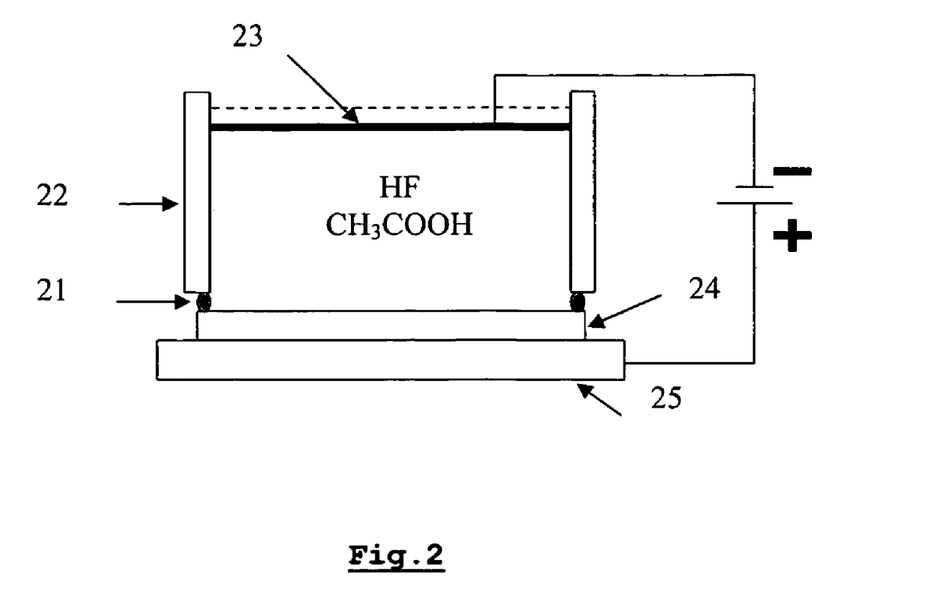
FIG. 2 represents a pSi formation set up.

Porous Si (pSi) is obtained by anodisation in a HF-based solution, using a two-electrode configuration (see FIG. 2) with a silicon working electrode (24) and a platinum counter electrode (23). Acetic acid is added to the HF as a surfactant to allow an efficient removal of the hydrogen bubbles formed during the pSi formation and results in a more homogeneous pSi layer. During the anodisation of the Si(111) substrate (21), the electrochemical dissolution of the Si atoms occurs in the vicinity of the interface between the already formed pSi layer and the Si substrate. Therefore the thickness of the pSi layer is controlled by the etching time. The relevant parameters for the pore formation are the current density, the doping type and level of the substrate, the electrolyte concentration and the possible illumination of the wafer. Since holes at the electrode surface are required for the dissolution of silicon, p-type silicon is readily etched in the dark, while with n-type material illumination is required. Porous layers with a porosity ranging from 10% to 90% and a thickness varying from 10 nm to a few micrometers can easily be achieved. This process results in homogenous porous layers over large wafer areas. FIG. 2 shows a pSi formation set up. 21 refers to the silicon substrate, 22 refers t th Teflon beaker, 23 to the Platinum electrode, 24 to the silicon anode and 25 refers to the back contact. The specific process conditions are:

anodisation 2" p-Si(111)
  thickness: 280 mm
  resistivity: 0.01 Wcm
  chemical solution: 2 HF/3 Acetic Acid
  current density: 75 mA/cm$^2$ This process results in 1.7 mm porous Si layer with a porosity of ~30%.

Figure 4:
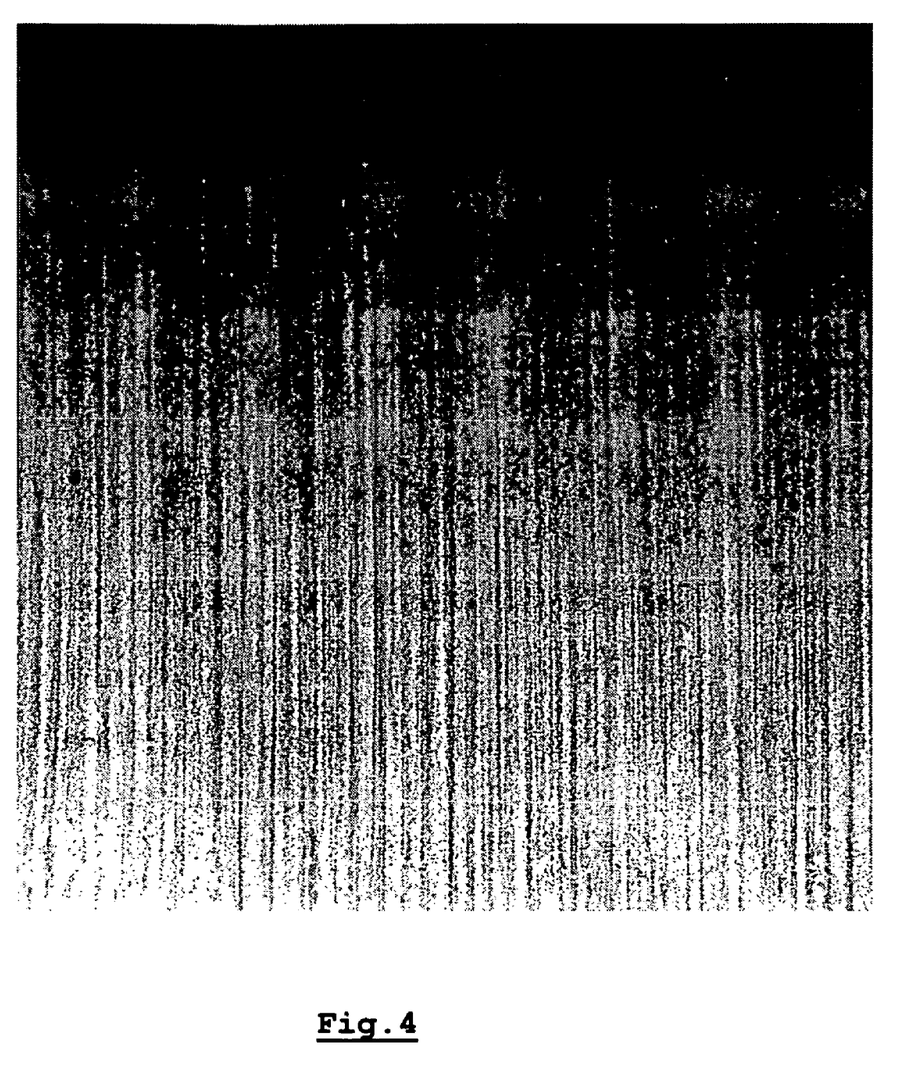
FIG. 4 represents a porous silicon substrate with a gradient in porosity, from low to high porosity.

FIG. 4 refers to a porous Si [001] substrate obtained by the method as described above.

Figure 5:
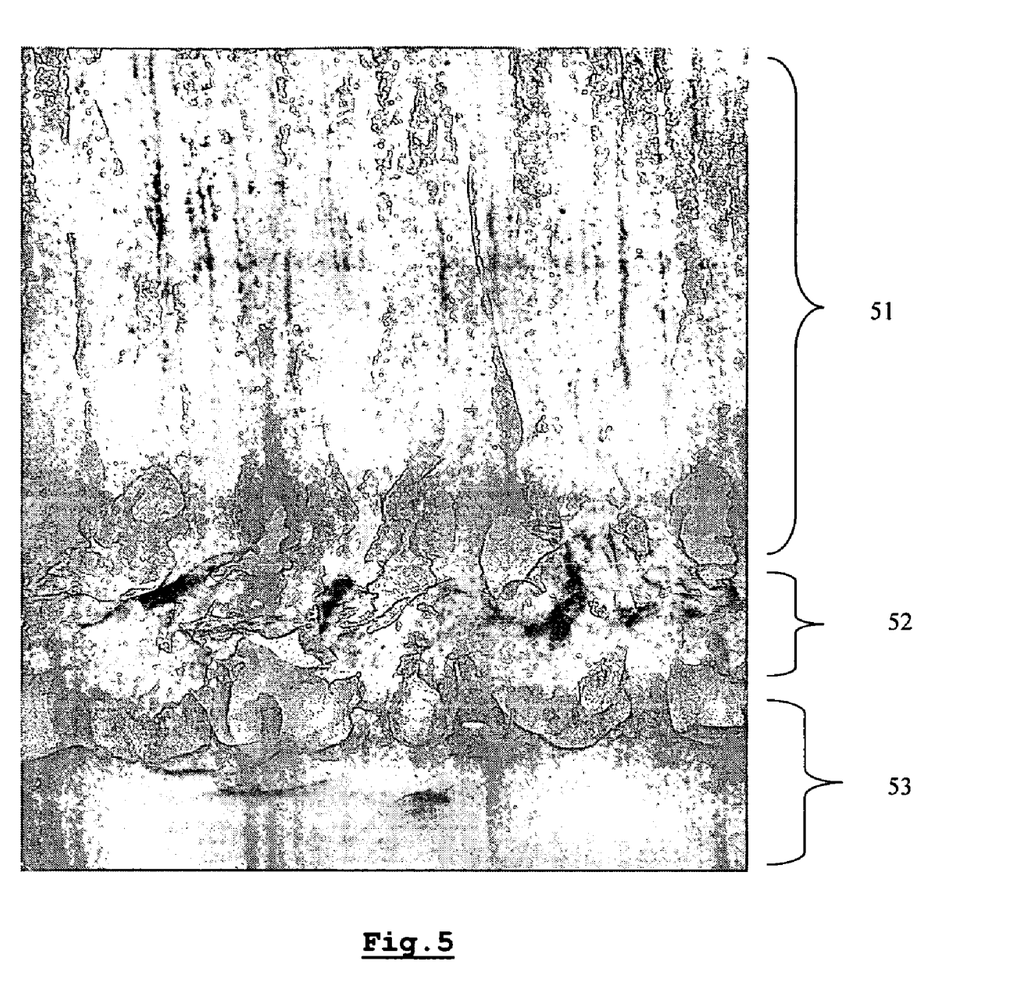
FIG. 5 represents a porous silicon substrate, comprising a silicon substrate (53), a layer of low (51) and high (52) porosity.
Figures 6A, 6B:
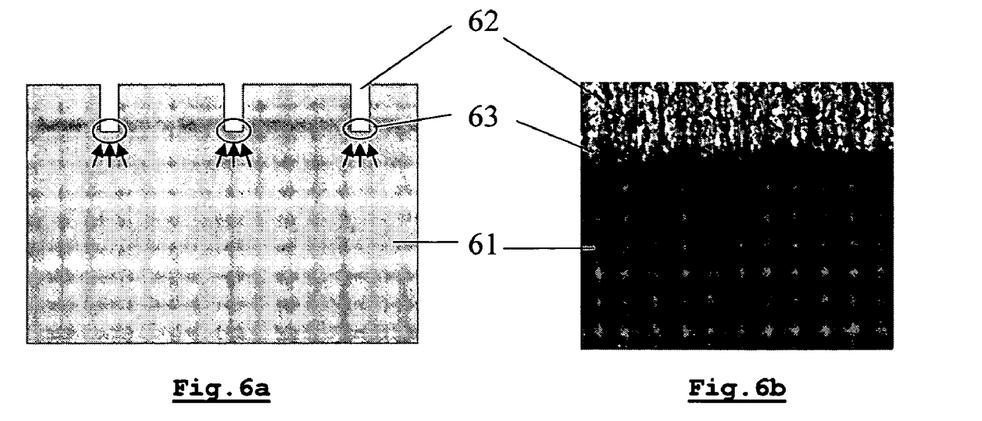
FIGS. 6a-f represent different steps in the formation of a porous top layer on a silicon [001] substrate by way of anodisation in a HF-based solution as described for instance in EP 1132952. The numeral 61 indicates the silicon substrate, 62 indicates pores, 63 indicates the point of reaction, 64 indicates a hydrogen molecule and 65 is the direction of the hydrodynamic force exerted by the molecule.
Figures 6C, 6D:
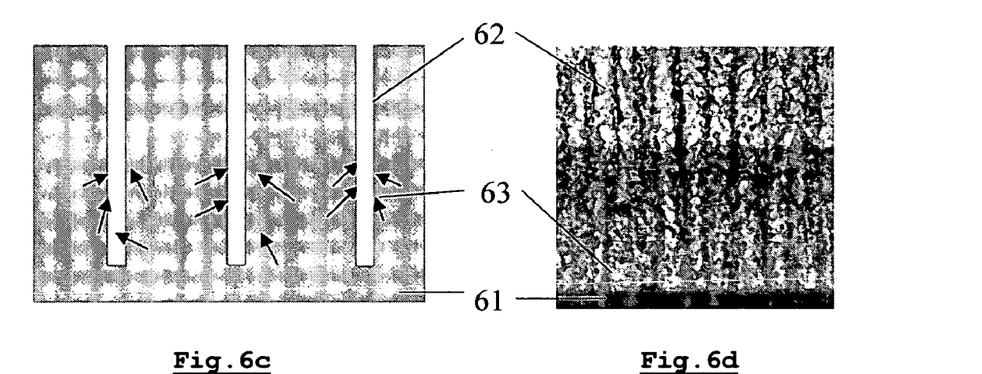
Figures 6E, 6F:
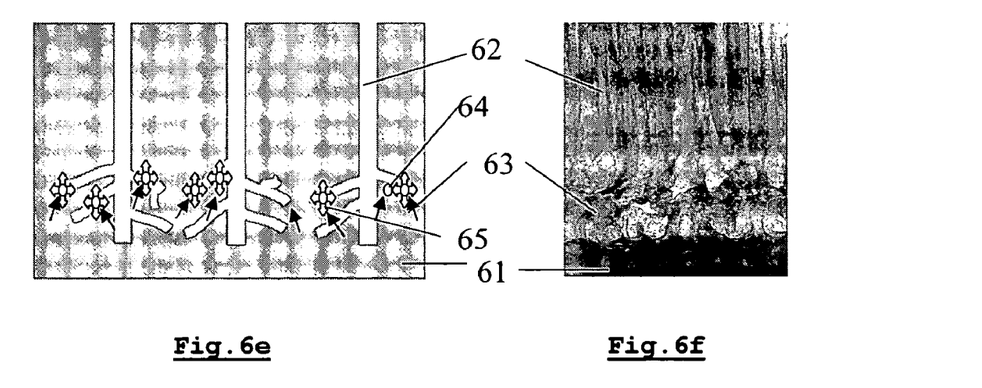

FIG. 5 represents a porous silicon [001] substrate, comprising a silicon substrate (53), a layer of low (51) porosity and a layer of high (52) porosity.

FIGS. 6a-f represent different steps in the formation of a porous top layer on a silicon [001] substrate by way of anodisation in a HF-based solution as described for instance in EP 1132952. The numeral 61 indicates the silicon substrate, 62 indicates pores, 63 indicates the point of reaction, 64 indicates a hydrogen molecule and 65 is the direction of the hydrodynamic force exerted by the molecule.

Figure 3A:
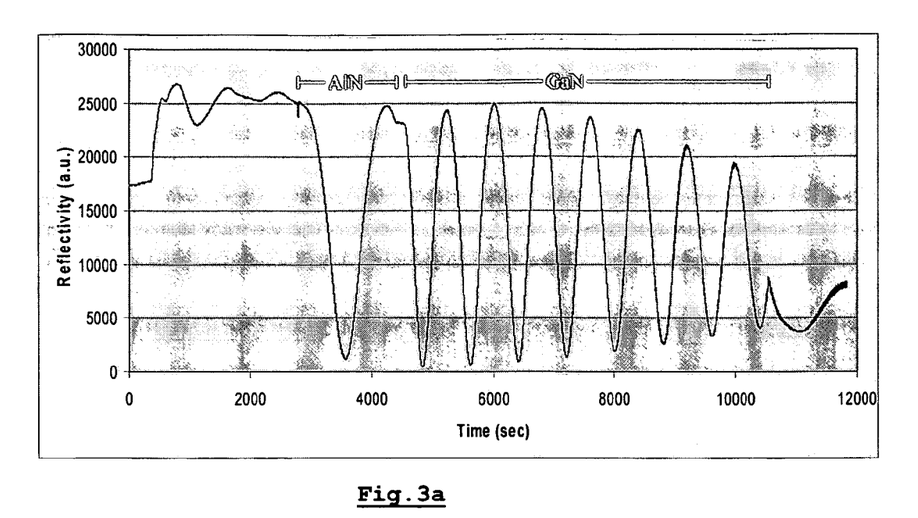
FIG. 3a represents the reflectivity as a function of time.
Figure 3B:
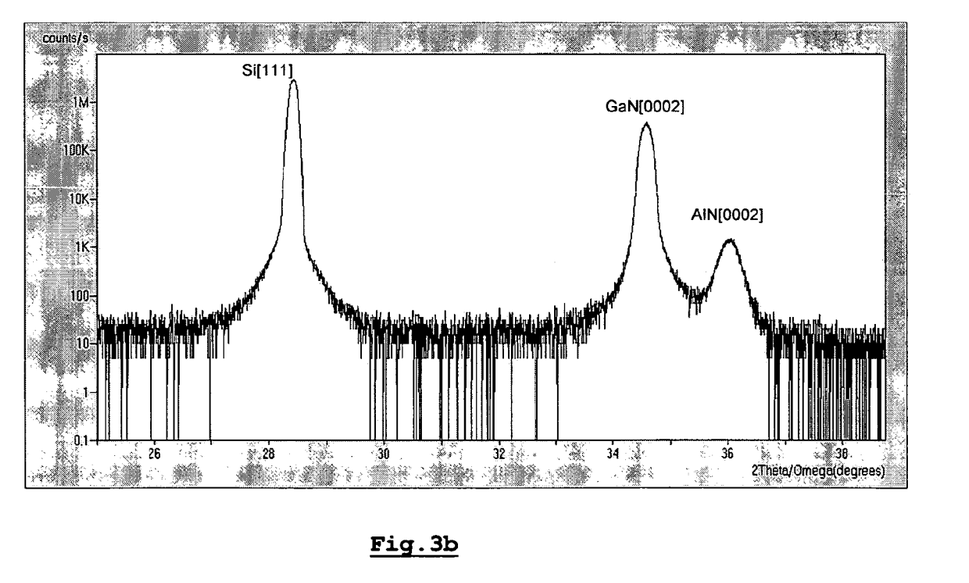
FIG. 3b represents XRD measurements.

After the pSi formation the wafer is thoroughly rinsed in DI-water until no traces of the electrolyte remain. The substrate is subsequently dried with $N_2$ and immediately loaded in a vacuum system to deposit the Ge layer. Immediately meaning that no oxidation of the porous Si occurs. The Ge is deposited in a Plasma Enhanced CVD system at a moderate temperature of about 500° C. and has a thickness in the range of 10 to 100 nm. PECVD results in the formation of epitaxial Ge layers on top of the Si substrate, as can be concluded from XRD analysis of the PECVD Ge layer. FIG. 3 shows a reflectivity and XRD measurement illustrating the growth of an epitaxial layer of GaN on top of the pSi (111).

This step is followed by a degassing and annealing step at 1125 degrees C., resulting in the formation of a SiGe layer.

In a next step, the substrate is subjected to TMAl and $NH_3$ in an MOCVD reactor and an intermediate layer of AlN is formed at 1100 degrees C. (rate: 7.5 nm/min, thickness 200 nm).

After depositing the Ge layer, the substrate is loaded in a MOCVD reactor. The substrate is subjected to TMGa and $NH_3$ at 1020 degrees C. (rate 10 nm/min, thickness 1 μm). The resulting reflectivity (FIG. 3a) and XRD measurements (FIG. 3b) show that a smooth epitaxial GaN layer is formed on top of the porous Si(111).

All references cited herein are incorporated herein by reference in their entirety and are hereby made a part of this specification. To the extent publications and patents or patent applications incorporated by reference contradict the disclosure contained in the specification, the specification is intended to supersede and/or take precedence over any such contradictory material.

The term "comprising" as used herein is synonymous with "including," % "containing," or "characterized by," and is inclusive or open-ended and does not exclude additional, unrecited elements or method steps.

All numbers expressing quantities of ingredients, reaction conditions, and so forth used in the specification and claims are to be understood as being modified in all instances by the term "about." Accordingly, unless indicated to the contrary, the numerical parameters set forth herein are approximations that may vary depending upon the desired properties sought to be obtained. At the very least, and not as an attempt to limit the application of the doctrine of equivalents to the scope of any claims in any application claiming priority to the present application, each numerical parameter should be construed in light of the number of significant digits and ordinary rounding approaches.

The above description discloses several methods and materials of the present invention. This invention is susceptible to modifications in the methods and materials, as well as alterations in the fabrication methods and equipment. Such modifications will become apparent to those skilled in the art from a consideration of this disclosure or practice of the invention disclosed herein. Consequently, it is not intended that this invention be limited to the specific embodiments disclosed herein, but that it cover all modifications and alternatives coming within the true scope and spirit of the invention.

The invention claimed is:

1. A method for forming a device comprising a Group III-nitride material on silicon, comprising the steps of:
   providing a substrate consisting essentially of silicon and comprising a porous top layer;
   depositing on the silicon substrate with the porous top layer a substance comprising Ge, thereby forming a second layer comprising a Ge material;
   thermally annealing the silicon substrate with the second layer comprising a Ge material, thereby forming a transformed second layer comprising SiGe on the top layer; and
   subjecting the silicon substrate with the transformed second layer comprising SiGe to a substance comprising a Group III element and a substance comprising N by a metal organic chemical vapour deposition process at a temperature of from about 1000° C. to about 1100° C., thereby forming a further layer comprising a Group III-nitride single crystal material on the transformed second layer.

2. The method of claim 1, wherein the step of thermally annealing is performed at a temperature of from about 500° C. to about 1300° C.

3. The method of claim 1, wherein the step of thermally annealing is performed at a temperature of from about 500° C. to about 1100° C.

4. The method of claim 1, wherein the step of depositing on the silicon substrate with the porous top layer a substance comprising Ge is performed by a method selected from the group consisting of plasma enhanced chemical vapour deposition, thermal evaporation, close space vapour transport, and molecular beam epitaxy.

5. The method of claim 1, further comprising a step of storing an intermediate device after the step of forming the second layer on the top layer prior to thermally annealing the silicon substrate with the second layer comprising a Ge material.

6. The method of claim 1, wherein the Group III element is Ga.

7. The method of claim 1, wherein the Group III-nitride material is GaN.

8. The method of claim 1, wherein the Group III element is Al.

9. The method of claim 1, wherein the Group III-nitride material is AlN.

10. The method of claim 1, further comprising the step of forming an intermediate layer comprising an AlN layer, wherein the step is conducted between the step of thermally annealing the silicon substrate with the second layer comprising a Ge material and the step of subjecting the silicon substrate with the transformed second layer comprising SiGe to a substance comprising a Group III element and a substance comprising N.

11. The method of claim 1, wherein the step of subjecting the silicon substrate with the transformed second layer comprising SiGe to a substance comprising a Group III element and a substance comprising N is performed at two different temperatures, and wherein the further layer comprises a GaN layer.

12. The method of claim 11 wherein the step of subjecting the silicon substrate with the transformed second layer comprising the SiGe to a substance comprising a Group III element and a substance comprising N by a metal organic chemical vapour deposition process is conducted at a temperature of from about 400° C. to about 800° C. followed by a temperature of from about 1000° C. to about 1100° C.

13. The method of claim 1, wherein the step of thermally annealing is performed at a temperature of from about 1050° C. to about 1100° C.

14. The method of claim 1, wherein the step of thermally annealing is performed at a temperature of about 1100° C., and wherein the Group III-nitride material is AlN.

15. The method of claim 1, wherein the step of thermally annealing is performed at a temperature of about 1050° C., and wherein the Group III-nitride material is GaN.

\* \* \* \* \*